United States Patent
Stoner et al.

(10) Patent No.: US 6,744,793 B2
(45) Date of Patent: Jun. 1, 2004

(54) METHOD AND APPARATUS FOR STABILIZING A BROADBAND SOURCE

(75) Inventors: Richard E. Stoner, Framingham, MA (US); Jacques P. Govignon, Watertown, MA (US); William P. Kelleher, Acton, MA (US); Stephen P. Smith, Medford, MA (US); Reinhardt Leon Willig, Maynard, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 10/017,351

(22) Filed: Dec. 14, 2001

(65) Prior Publication Data

US 2002/0191243 A1 Dec. 19, 2002

Related U.S. Application Data

(60) Provisional application No. 60/257,875, filed on Dec. 21, 2000.

(51) Int. Cl.⁷ ................................................. H01S 3/13
(52) U.S. Cl. ...................... 372/32; 372/29.02; 359/110; 359/187
(58) Field of Search ................. 372/29.02, 32; 359/110, 187

(56) References Cited

U.S. PATENT DOCUMENTS

| | | | |
|---|---|---|---|
| 3,593,189 A | 7/1971 | Buhrer | 331/94.5 |
| 3,686,585 A | 8/1972 | Javan et al. | 331/94.5 |
| 4,692,716 A | 9/1987 | De Marchi et al. | 331/3 |
| 4,912,716 A | 3/1990 | Mead | 372/32 |
| 4,914,662 A | 4/1990 | Nakatani et al. | 372/32 |
| 5,008,889 A | 4/1991 | Wilson | 372/32 |
| 5,177,633 A | 1/1993 | Wong | 359/330 |
| 5,189,677 A | 2/1993 | Yry | 372/23 |
| 5,218,421 A | 6/1993 | Wakabayashi et al. | 356/352 |
| 5,221,983 A * | 6/1993 | Wagner | 359/125 |
| 5,325,095 A * | 6/1994 | Vadnais et al. | 342/22 |
| 5,333,000 A * | 7/1994 | Hietala et al. | 342/368 |
| 5,373,515 A | 12/1994 | Wakabayashi et al. | 372/20 |

(List continued on next page.)

OTHER PUBLICATIONS

Active Stabilization; <URL http://www.sacher.de/plug04.htm> online Mar. 2, 2001.

Frequency Stabilization of Laser Diodes Using 1.51–1.55 $\mu$m Absorption Lines of $^{12}C_2H_2$ and $^{13}C_2H^{2;}$ Yoshihisa Sakai, Shoichi Sudo, Member, IEEE, and Tetsuhiko Ikegami, Fellow, IEEE; IEEE Journal of Quantum Electronics, vol. 28, No. 1, Jan. 1992.

Copy of International Search Report for PCT/US01/48429 (4 pgs.).

Lepley et al., "Primary referenced DWDM frequency comb generator," *IEE Proceedings: Optoelectronics*, vol. 146, pp. 121–124, Jun. 1999.

* cited by examiner

*Primary Examiner*—Paul Ip
*Assistant Examiner*—Delma R. Flores-Ruiz
(74) *Attorney, Agent, or Firm*—Testa, Hurwitz & Thibeault, LLP (57) ABSTRACT

The invention relates to a method and system for wavelength stabilization of a broadband optical source. The method and system are based on utilizing an optical power divider to generate two optical signals for each of the broadband source and a reference wavelength source. The difference in the power ratio of the two optical signals derived from the broadband source and the power ratio of the two optical signals derived from the reference wavelength source is determined. Because the power ratios are similarly affected by component aging and changes in environmental factors such as temperature and incident radiation, the difference in the power ratios can be used to adjust the wavelength of the broadband source so that its center wavelength is stabilized to the center wavelength of the reference source.

12 Claims, 7 Drawing Sheets

U.S. PATENT DOCUMENTS

| | | | |
|---|---|---|---|
| 5,390,203 A | 2/1995 | Miller | 372/29 |
| 5,404,366 A | 4/1995 | Wakabayashi et al. | 372/29 |
| 5,563,705 A | 10/1996 | Sanders | 356/350 |
| 5,565,867 A | 10/1996 | Tiemann | 341/143 |
| 5,627,644 A | 5/1997 | Sanders | 356/350 |
| 5,684,590 A | 11/1997 | Sanders et al. | 356/350 |
| 5,748,316 A | 5/1998 | Wakabayashi et al. | 356/352 |
| 5,780,843 A * | 7/1998 | Cliche et al. | 250/226 |
| 5,825,792 A | 10/1998 | Villeneuve et al. | 372/32 |
| 5,914,781 A | 6/1999 | Jaklitsch et al. | 356/350 |
| 6,009,111 A | 12/1999 | Corwin et al. | 372/32 |
| 6,041,072 A | 3/2000 | Ventrudo et al. | 372/102 |
| 6,115,124 A | 9/2000 | Hall et al. | 356/350 |
| 6,144,025 A | 11/2000 | Tei et al. | 250/226 |
| 6,282,005 B1 * | 8/2001 | Thompson et al. | 359/173 |
| 6,493,131 B1 * | 12/2002 | Tarng et al. | 359/326 |

* cited by examiner

METHOD AND APPARATUS FOR STABILIZING A BROADBAND SOURCE

CROSS REFERENCE TO RELATED APPLICATIONS

This application claims priority to provisional U.S. patent application Ser. No. 60/257,875 which was filed Dec. 21, 2000.

GOVERNMENT RIGHTS IN THE INVENTION

This invention was made with government support under Contract No. N00030-00-C-0013 awarded by the Navy. The government may have certain rights in the invention.

FIELD OF THE INVENTION

The invention relates generally to wavelength stabilization of broadband sources and more specifically to a method and apparatus for stabilizing a characteristic wavelength of a broadband source using an optical power divider and a stable reference optical source.

BACKGROUND OF THE INVENTION

Stable broadband sources are useful in a variety of applications including, for example, telecommunications test equipment, optical tomography systems, optical distance measurement systems, and interferometric fiber optic gyroscopic (IFOG) navigation equipment. Various methods to stabilize a broadband source have been developed. For example, one method employs an unbalanced interferometer stabilized to a Helium-Neon laser reference source. The broadband source to be controlled, however, must have a coherence length at least as long as the difference in the optical paths of the interferometer. Unfortunately, reducing the difference in the optical paths typically reduces the wavelength sensitivity of the method. Thus, this method is highly dependent on the degree of residual coherence in the broadband source.

Another method developed for use with IFOG navigation equipment employs a directional coupler as a wavelength reference. Optical energy from a broadband source is injected into the directional coupler. The coupler separates the optical energy into two output ports. The optical energy is divided between the two output ports according to wavelength. The optical power exiting the two outputs of the directional coupler is balanced, thereby matching the center wavelength of the broadband source to the characteristic center wavelength of the directional coupler, which serves as the wavelength reference for the broadband source. One disadvantage of this technique is that temperature variations change the characteristic center wavelength of the directional coupler. Also, the two photodetectors used to measure the power output from the two output arms of the coupler must have closely matched responsivities. Any systematic influence which affects the responsivity match of the photodetectors and/or changes the center wavelength of the directional coupler results in an unwanted shift in the center wavelength of the broadband source. For precise wavelength control, the directional coupler and photodetectors are typically housed in a temperature-stabilized environment, which can be prohibitive for applications in which space is limited. Additionally, the central wavelength of the directional coupler is sensitive to gamma and neutron radiation exposure, making this method impractical for strategic guidance applications.

A need exists for a method to stabilize broadband sources that is substantially insensitive to environmental factors and not limited by coherence length.

SUMMARY OF THE INVENTION

The invention relates to a method and system for wavelength stabilization of a broadband optical source. The method and system are based on utilizing an optical power divider to generate two optical signals for each of the broadband source and a reference wavelength source. The difference in the power ratio of the two optical signals derived from the broadband source and the power ratio of the two optical signals derived from the reference wavelength source is determined. Because the power ratios are similarly affected by component aging and changes in environmental factors such as temperature and incident radiation, the difference in the power ratios can be used to adjust the wavelength of the broadband source so that its center wavelength is stabilized to the center wavelength of the reference source.

In one aspect, the invention relates to a method for wavelength stabilization of a broadband optical source having a center wavelength. The method includes generating a first split broadband optical signal and a second split broadband optical signal in response to a wavelength transfer characteristic and the broadband optical signal. The method also includes generating a first split optical reference signal and a second split optical reference signal in response to the wavelength transfer characteristic and a reference optical signal having a reference wavelength. The method further includes determining a broadband power ratio of the first and second split optical signals, determining a reference power ratio of the first and second split optical reference signals, and determining a difference between the center wavelength and the reference wavelength in response to the power ratios. In one embodiment the method also includes adjusting the center wavelength of the broadband optical signal in response to the difference of the center wavelength and the reference wavelength.

In another aspect, the invention relates to a system for generating a wavelength stabilized optical signal including a broadband optical source, a wavelength reference module and an optical power divider. The broadband optical source is configured to provide a broadband optical signal having a broadband center wavelength and the wavelength reference module is configured to provide a reference optical signal having a reference center wavelength. The optical power divider has a divider input port in optical communication with the broadband optical source and the wavelength reference module. The optical power divider also has a first divider output port and a second divider output port. The optical divider is configured to provide a first split broadband optical signal and a second split broadband optical signal at the first and second divider output ports, respectively, in response to the broadband optical signal. The optical power divider is also configured to provide a first split reference optical signal and a second split reference optical signal at the first and second divider output ports, respectively, in response to the reference optical signal. The power ratio of the first and second split optical signals is responsive to the broadband center wavelength and the power ratio of the first and second split reference optical signals is responsive to the reference center wavelength.

In one embodiment the system also includes a first detector in optical communication with the first divider output port and a second detector in optical communication with the second divider output port. In a further embodiment, the system also includes a wavelength control module in communication with the first and second detectors. The wavelength control module determines the power ratio of the first and second split broadband optical signals and also determines the power ratio of the first and second split reference optical signals. A broadband source control signal is generated by the wavelength control module in response to the power ratios.

In one embodiment the system also includes an optical combiner in optical communication with the broadband optical source, the wavelength reference module and the optical power divider. In another embodiment, the system includes a broadband optical modulator in optical communication with the broadband optical source and the optical power divider. In another embodiment, the system includes a reference optical modulator in optical communication with the wavelength reference module and the optical power divider. In another embodiment, the system includes an optical modulator in optical communication with the broadband optical source, the wavelength reference module, and the optical power divider.

BRIEF DESCRIPTION OF THE DRAWINGS

The above and further advantages of the invention may be better understood by referring to the following description taken in conjunction with the accompanying drawings, in which.

DETAILED DESCRIPTION

Figure 1:
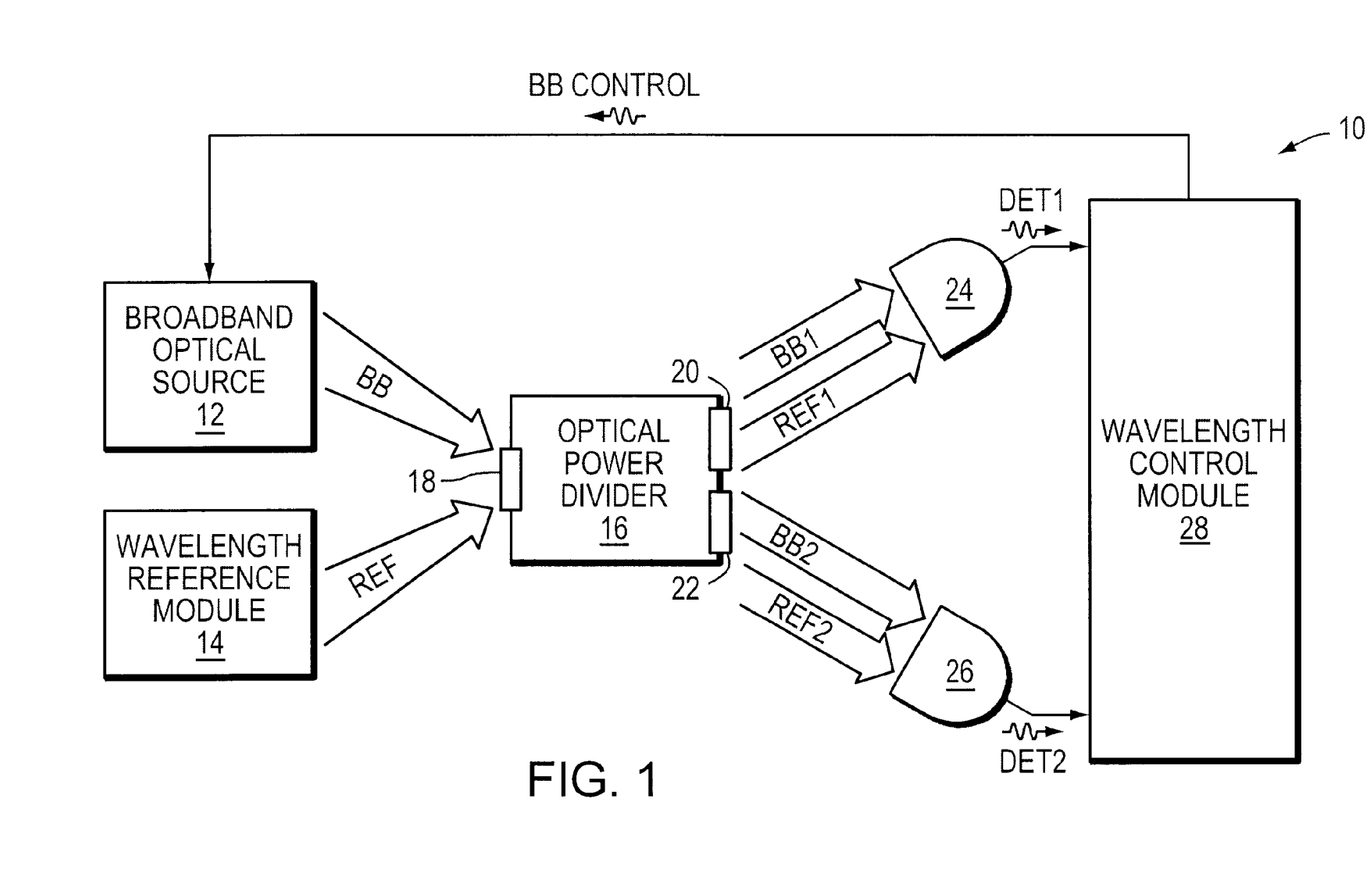
FIG. 1 is a highly schematic block diagram of a system for generating a wavelength stabilized optical signal according to the invention.

Referring to FIG. 1, a system 10 for wavelength stabilization of a broadband optical source includes a broadband source 12, a wavelength reference module 14 and an optical power divider 16. The broadband source 12 and the wavelength reference module 14 provide a broadband optical signal (BB) and a reference optical signal (REF), respectively, to the input port 18 of the optical power divider 16. A first split broadband optical signal (BB1) and a second split broadband optical signal (BB2) are generated at the first and second divider output ports 20 and 22, respectively. Similarly, a first split reference optical signal (REF1) and a second split reference optical signal (REF2) are generated at the first and second divider output ports 20 and 22, respectively. The first split optical signals (BB1) and (REF1) are incident on a first photodetector 24, and the second split optical signals (BB2) and (REF2) are incident on a second photodetector 26. A wavelength control module 28 generates a broadband control signal (BB CONTROL) in response to received electrical signals DET1 and DET2 from detectors 24 and 26, respectively.

The broadband optical source 12 can be, for example, an edge-emitting LED (ELED); a rare-earth-doped superluminescent source (REDSLS); a light-emitting diode (LED); or a superluminescent diode (SLD). The optical power provided by the broadband source 12 is distributed over a limited spectral range (e.g., 10–100 nm) and has a characteristic center wavelength $\lambda_C$. The specific definition of the center wavelength $\lambda_C$ chosen depends on the particular application for the broadband source 12. The transfer function of the optical power divider 16 determines the center wavelength $\lambda_{OPD}$ extracted by the optical power divider 16. One example of a center wavelength $\lambda_C$ for an optical power spectrum $P(\lambda)$ associated with an optical power divider having a linear transfer function over the spectral range of the broadband source 12 is given by the mean wavelength wherein $\lambda_C = \int d\lambda \cdot P(\lambda) \cdot \lambda / \int d\lambda \cdot P(\lambda)$. An example of a center wavelength $\lambda_C$ associated with an optical power divider 16 having a transfer function which is a step function in wavelength is the median wavelength. Thus the center wavelength $\lambda_C$ is defined as the wavelength at which the optical power for wavelengths less than the median wavelength is equal to the optical power at wavelengths greater than the median wavelength.

The wavelength reference module 14 provides optical power at a reference wavelength $\lambda_{REF}$. The reference wavelength $\lambda_{REF}$ is substantially unaffected by environmental conditions and, therefore, remains substantially constant.

The combined optical energy from both sources 12 and 14 is divided (i.e., separated) according to wavelength by the optical power divider 16. As the center wavelength $\lambda_C$ of the optical energy from the broadband source 12 varies, the ratio of the power of the split optical signals BB1 and BB2 also varies. The difference between the ratio and a fixed value can be used to stabilize the center wavelength $\lambda_C$ if the characteristic center wavelength $\lambda_{OPD}$ of the optical power divider 16 is immune to environmental conditions. In many applications, however, the spectral performance of the optical power divider 16 varies significantly with mechanical and thermal variations, and with incident radiation. Because the wavelength reference source 14 is substantially independent of variations in system and environmental parameters, any change to the ratio of the reference optical signals REF1 and REF2 is primarily attributable to the change in the center wavelength $\lambda_{OPD}$ of the optical power divider 16. Changes in the optical power divider characteristics are common-mode effects, consequently the broadband power ratio and the reference power ratio are affected in a similar way and the comparison of the ratios is unaffected. In particular, if the variation for each ratio is approximately linear with respect to the variation in the characteristic wavelength $\lambda_{OPD}$ of the optical power divider 16, the difference of the broadband power ratio and the reference power ratio can be used to determine the difference between the broadband center wavelength $\lambda_C$ and the reference wavelength $\lambda_{REF}$.

Under active control, the wavelength discrepancy between the broadband center wavelength $\lambda_C$ and the reference wavelength $\lambda_{REF}$ is nulled (i.e., the ratios are matched) by adjusting the broadband source wavelength spectrum according to the control signal (BB CONTROL) generated by the wavelength control module 28. Thus, the broadband center wavelength $\lambda_C$ is locked to the reference wavelength $\lambda_{REF}$.

Figure 2A:
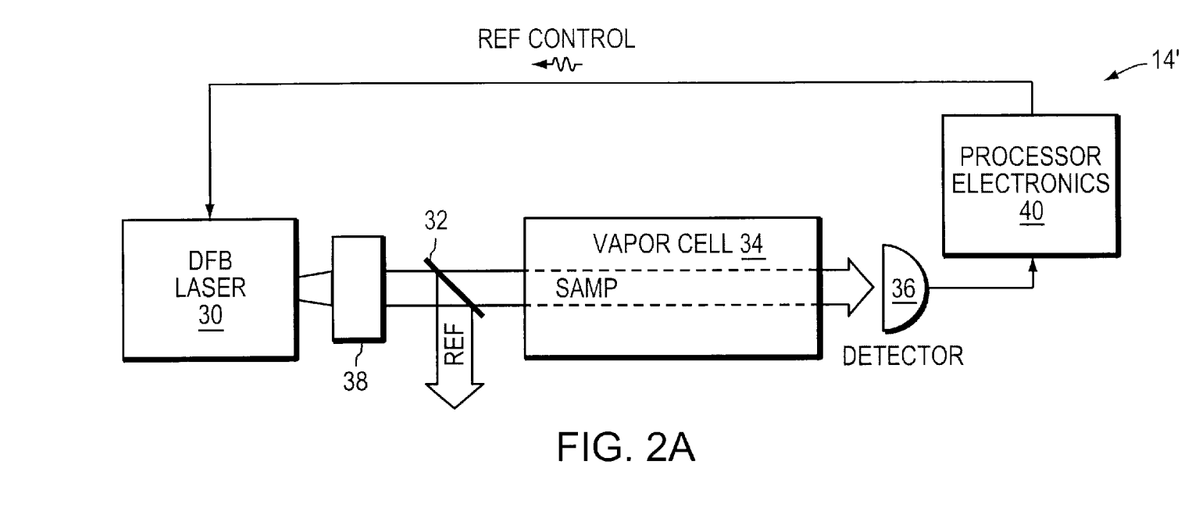
FIGS. 2A and 2B are a block diagram of an embodiment of a wavelength reference source and its corresponding detected power spectrum, respectively, according to the invention.
Figure 2B:
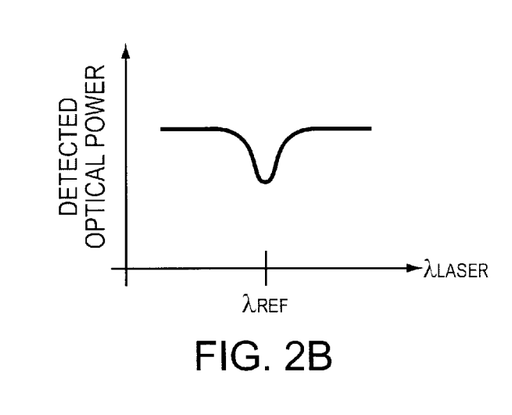

Referring to the block diagram of FIG. 2A, one embodiment of a wavelength reference module 14' includes a semiconductor distributed feedback (DFB) laser 30, a beamsplitter 32, a vapor cell 34 and an optical detector 36. A collimator 38 collimates the optical beam emitted by the DFB laser 30. The DFB laser 30 is tunable over a limited spectral range. Beamsplitter 32 provides most of the optical energy in the DFB laser beam as the reference optical signal REF to the optical power divider 16 (not shown). A substantially lower energy optical beam SAMP (e.g., 50 μW beam) is transmitted from beamsplitter 32 to optical detector 36 through vapor cell 34. The vapor cell 34 is pressurized to a few hundred torr with a molecular gas such as acetylene, hydrogen cyanide or ammonia. The low energy beam SAMP incident on the detector 36 has a detected optical power spectrum illustrated in FIG. 2B. The detected optical power has a local minimum for a gas resonance corresponding to the reference wavelength $\lambda_{REF}$. For example, acetylene gas has several such resonances yielding absorption lines in the 1.51 μm–1.54 μm wavelength region. Processor electronics module 40 receives the electrical signal generated by the detector 36 and generates a control signal REF CONTROL to maintain the wavelength of the DFB laser 30 at the maximum absorption wavelength $\lambda_{REF}$.

Figure 3A:
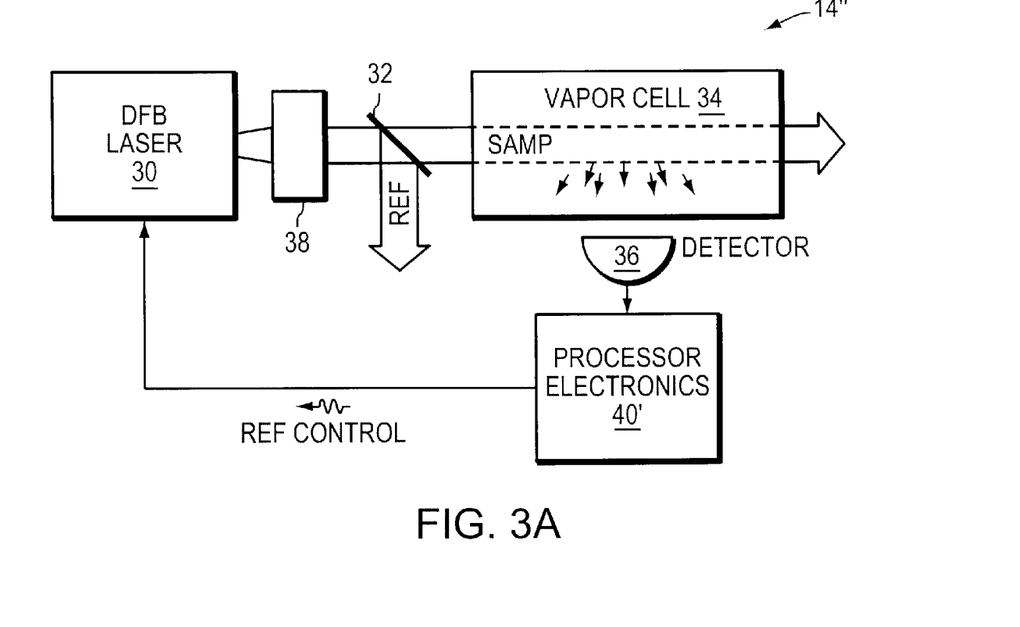
FIGS. 3A and 3B are a block diagram of an embodiment of a wavelength reference source and its corresponding detected power spectrum, respectively, according to the invention.
Figure 3B:
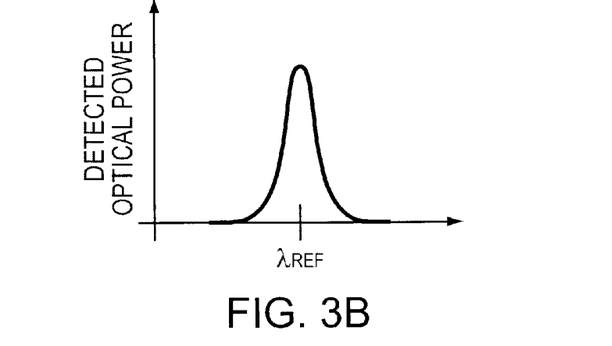

Referring to the block diagram of FIG. 3A, another embodiment of a wavelength reference module 14" includes the semiconductor distributed feedback (DFB) laser 30, collimator 38, beam splitter 32, vapor cell 34 and optical detector 36 of FIG. 3A. The detector 36, however, is adapted to detected fluorescence emitted through the side of the vapor cell 34. The fluorescence is the result of the decay of the atoms in the vapor cell 34 that are excited by the absorbed laser radiation. The detected fluorescence has a local maximum at a resonance wavelength $\lambda_{REF}$ as depicted in FIG. 3B. The processor electronics module 40' in this embodiment generates a control signal REF CONTROL to lock the laser wavelength to the fluorescence peak wavelength $\lambda_{REF}$.

The stability of the reference source 14 is limited by the linewidth of the gas transition, and the signal to noise ratio of the detector 36 and processing electronics 40. Generally the gas transition is collisionally broadened and Doppler-broadened to approximately 1 GHz at room temperature. A signal to noise ratio of 1000 results in a fractional wavelength stability of approximately 3 ppb. Because the wavelength of the molecular transition is substantially insensitive to static magnetic and electric fields, no shielding of the vapor cell 34 is required. Moreover, a minor change in the sensitivity of the detector 36 does not result in a substantial performance degradation.

Although the wavelength reference modules 14' and 14" described above use a molecular vapor cell, one of ordinary skill will appreciate that other wavelength references can be used without departing from the scope of the invention.

Figure 4:
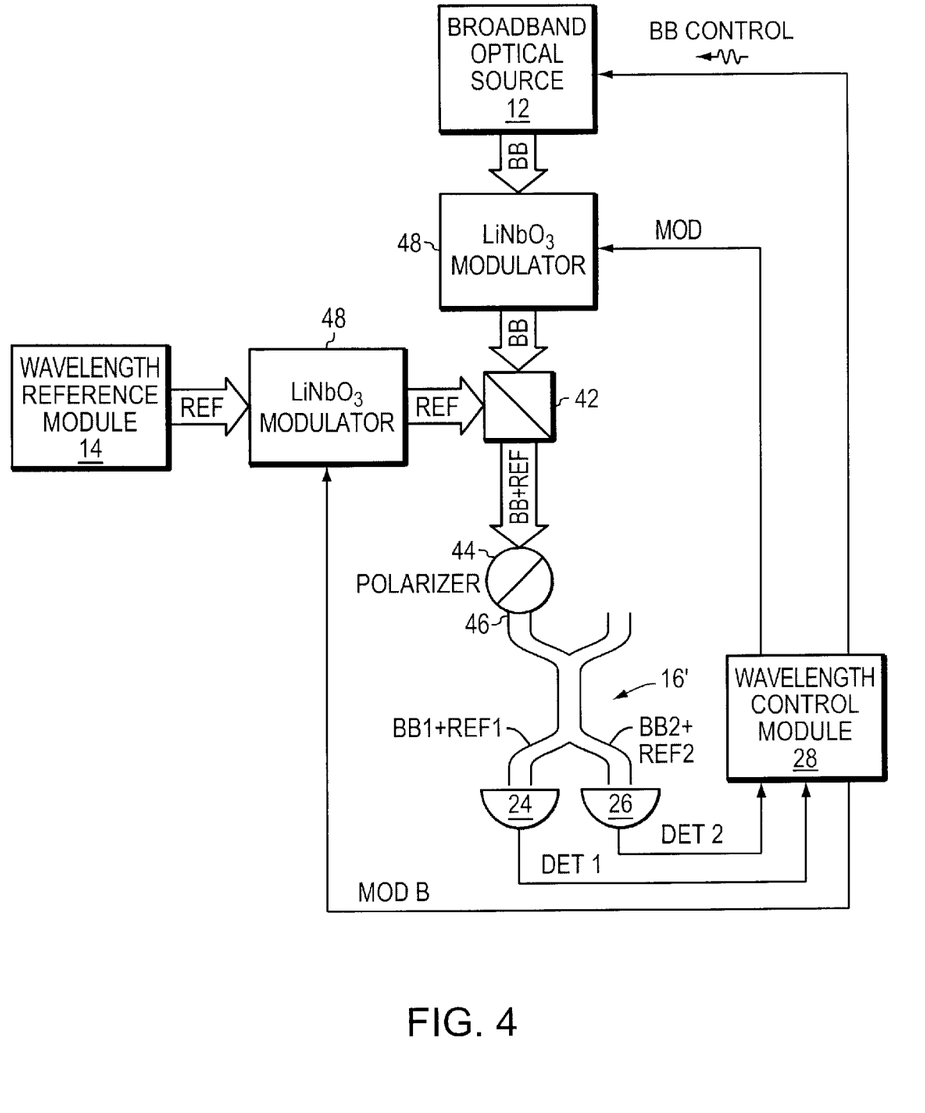
FIG. 4 is a block diagram of a system for generating a wavelength stabilized optical signal according to the invention.

The center wavelength $\lambda_C$ of the broadband source is compared to the reference wavelength $\lambda_{REF}$ using the optical power divider 16 (see FIG. 1). Referring to FIG. 4, in one embodiment the optical power divider 16 is a directional coupler 16'. In alternative embodiments not described herein, the optical power divider 16 can be a dichroic filter or a configuration of common optical components that separates an incident beam into two beams according to a center wavelength $\lambda_{OPD}$. The broadband optical signal BB and reference optical signal REF are provided to optical combiner 42 which transmits a combined optical signal (BB+REF) to an input port 46 of the directional coupler 16' through a polarizer 44. The polarizer 44 substantially reduces the effects of any polarization dependence of the center wavelength $\lambda_{OPD}$ of the optical power divider 16' by rendering the polarizations of the components of the combined optical beam BB+REF parallel.

Both of the broadband optical signal BB and the reference optical signal REF are intensity-modulated by a respective lithium niobate optical modulator 48 so that their respective contributions to the detector signals DET1 and DET2 can be identified. In the illustrated embodiment, the optical beams BB and REF are modulated according to modulator drive signals MOD and MODB which are at the same frequency but oppositely phased. In other embodiments, the modulation frequencies are different. In one such embodiment, only one of the optical signals BB and REF is modulated. In other embodiments, the optical modulators 48 are electro-optic shutters, electro-absorption optical devices or mechanical light choppers.

The optical combiner 42 in the illustrated embodiment can be, for example, a non-polarizing beam splitter or a fiber coupler. The wavelength response of the optical combiner 42 is flat over the spectral range of the broadband source 12 and the relative transmissions of the combiner 42 are selected to achieve a high signal to noise ratio for the external system (e.g., an IFOG system) utilizing the broadband source 12. The optical power of the broadband optical signal BB is generally lower than the optical power of the reference optical signal REF. Consequently, the combiner transmission for the broadband optical signal BB is substantially greater than the combiner transmission for the reference optical signal REF (e.g., 90% and 10%, respectively).

In the illustrated embodiment, the sum and difference of the photodetector signals DET1 and DET2 are formed electronically. The power of the reference optical signal REF is adjusted to match to the power of the broadband optical signal BB by a standard feedback circuit (not shown) that nulls the demodulated sum signal. The center wavelength $\lambda_C$ of the broadband optical source 12 is locked to the reference wavelength $\lambda_{REF}$ by maintaining the demodulated difference signal at zero. This is accomplished by providing error signal BB CONTROL to adjust the wavelength $\lambda_C$ of the broadband source 12.

Figure 5:
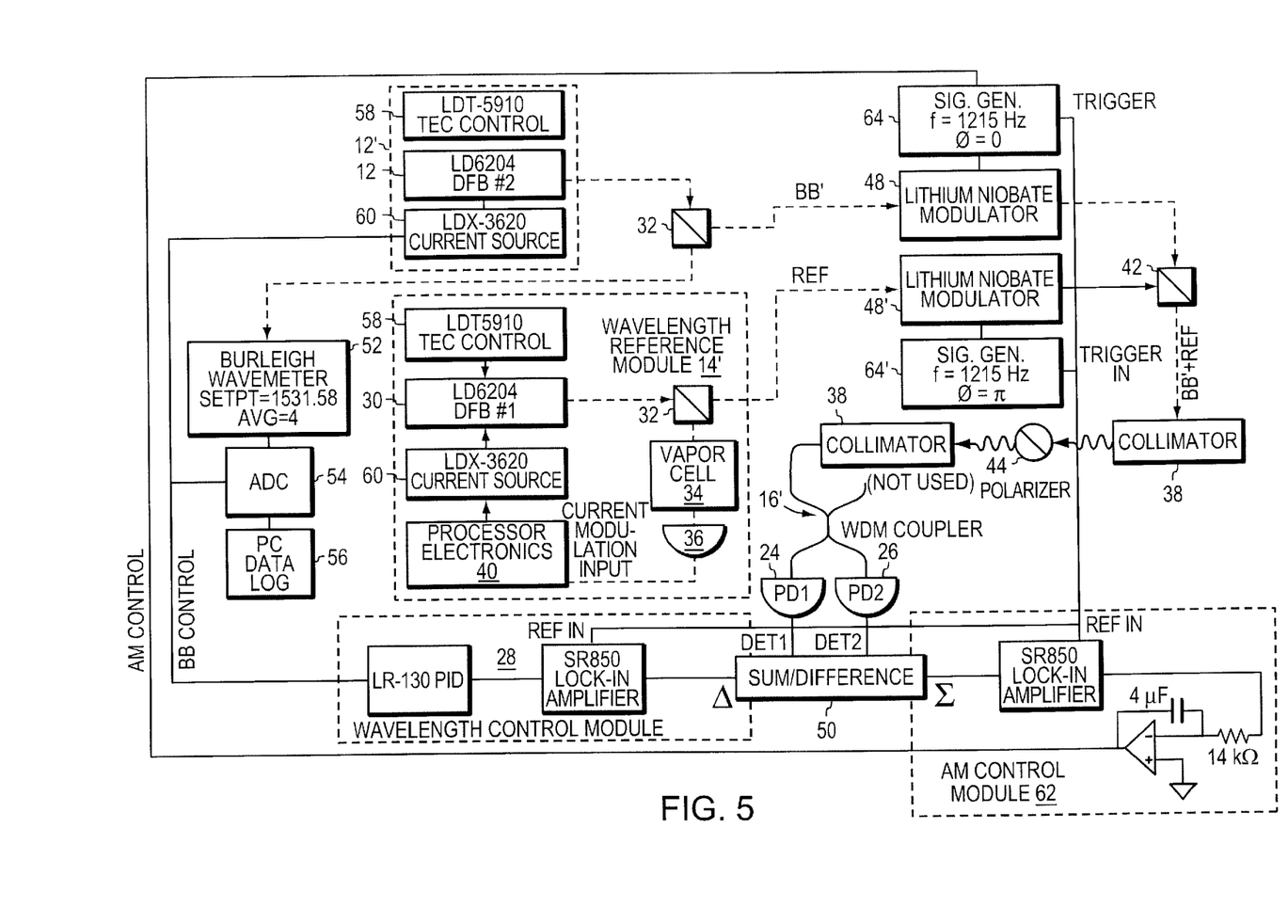
FIG. 5 is a schematic diagram of a test configuration for an embodiment of the invention.

Referring to FIG. 5, a laboratory verification test configuration includes laser module 12' as a mock broadband optical source convenient for determination of the broadband center wavelength $\lambda_C$. The mock broadband source 12' and the wavelength reference module 14' each include a DFB laser 12 and 30, respectively, Marconi-Caswell model no. LD6204, a thermoelectric temperature controller 58 ILX Lightwave model no. LDT-5910 and a laser current source 60 ILX Lightwave model no. LDX-3620. The mock broadband optical signal BB' is modulated by a lithium niobate modulator 48 SDL Integrated Optics model no. IOAP-9189 at a modulation frequency f of 1.215 KHz in response to a drive signal derived from signal generator 64. The reference optical signal REF is modulated by a second lithium niobate modulator 48' at a modulation frequency ƒ of 1.215 KHz at opposite phase (i.e., π radians phase difference between the modulated optical signals). The drive signal for the second modulator 48' is provided by a second signal generator 66 synchronized to the first signal generator 64. Collimator units 38 collimates the combined modulated optical signal BB'+REF between beamsplitter 42 and directional coupler 16'.

The test configuration also includes a sum and difference module 50, a wavelength control module 28 and an AM control module 62. The wavelength control module 28 receives a difference signal Δ that is the difference of the detector signals DET1 and DET2. Broadband control signal BB CONTROL is generated in response to the demodulated difference signal Δ. The laser current source 60 changes the laser current and consequently the wavelength of the mock broadband optical signal BB' to null the difference signal Δ. The amplitude control module 62 receives a sum signal Σ that is the sum of the detector signals DET1 and DET2. Amplitude control signal AM CONTROL is generated in response to the demodulated sum signal Σ. The amplitude control signal AM CONTROL is used to modulate the drive signal generated by the first signal generator 64, thereby modulating the optical power of the mock broadband optical signal BB'. Thus the amplitude control signal AM CONTROL compensates for any variations in the optical power of the mock broadband optical signal BB' and/or the reference optical signal REF.

The wavelength stabilization achieved with the test configuration is determined by monitoring the magnitude of the broadband control signal BB CONTROL as the wavelength of the mock broadband optical signal BB' is varied. The wavelength of the mock broadband optical signal BB' is measured with wavelength measurement device 52 Burleigh Instruments Wavemeter model no. WA-1500. The wavelength data and the broadband control signal BB CONTROL are digitized by an analog-to-digital converter 54 and recorded by a data logger 56.

Figure 6:
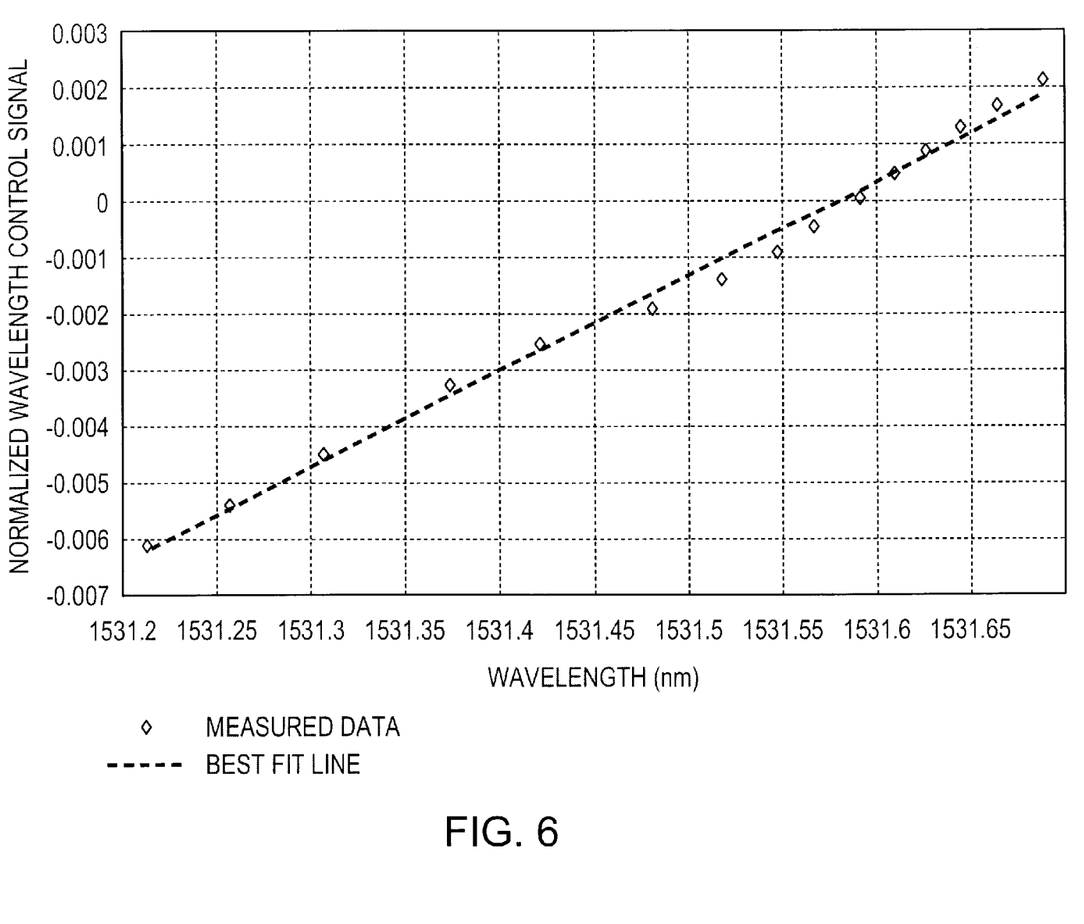
FIG. 6 is a graphical representation of the normalized wavelength control signal as a function of wavelength for the test configuration of FIG. 5.
Figure 7:
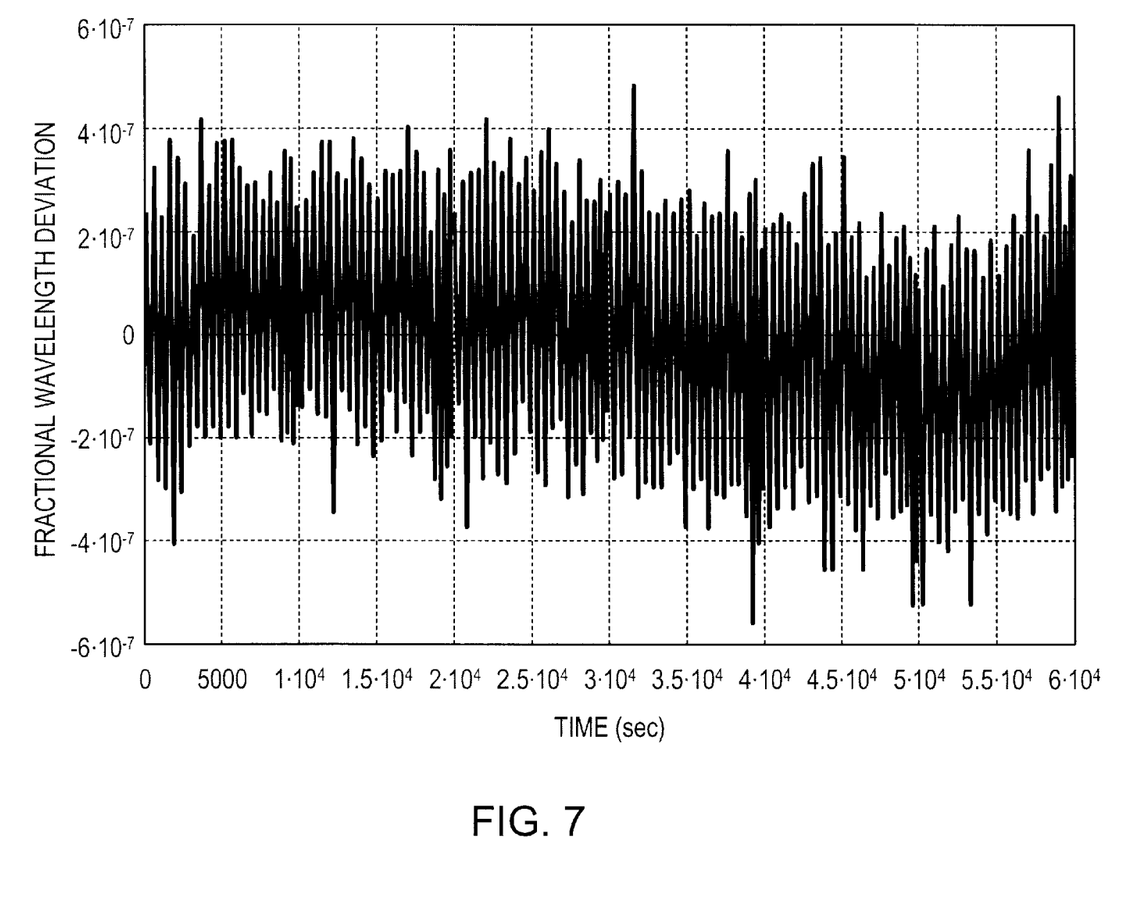
FIG. 7 is a graphical representation of the wavelength deviation for the stabilized mock broadband source in the test configuration of FIG. 5.

FIG. 6 displays a normalized plot of the wavelength control signal BB CONTROL measured in the verification test configuration of FIG. 5. The plot indicates that the broadband control signal BB CONTROL is zero when the wavelength of the mock broadband source 12' matches the reference wavelength $\lambda_{REF}$ of approximately 1531.58 nm. FIG. 7 displays a plot of the wavelength deviation for the stabilized mock broadband source 12' over more than 16 hours. A fractional wavelength stability of less than 0.14 ppm was achieved in an uncontrolled environment using commercially available components. Improved stability (0.1 ppm or better) can be expected for systems utilizing precision and/or custom components, and with improved packaging and optical interconnections.

Having described and shown the preferred embodiments of the invention, it is now apparent to one of skill in the art that other embodiments incorporating the concepts may be used and that many variations are possible which are within the scope and spirit of the invention. It is felt, therefore, that these embodiments should not be limited to disclosed embodiments but rather should be limited only by the spirit and scope of the invention.

What is claimed is:

1. A method for wavelength stabilization of a broadband optical signal having a center wavelength, comprising:
   generating a first split broadband optical signal and a second split broadband optical signal in response to a wavelength transfer characteristic and said broadband optical signal;
   generating a first split optical reference signal and a second split optical reference signal in response to said wavelength transfer characteristic and a reference optical signal having a reference wavelength;
   determining a broadband power ratio of said first and second split optical signals;
   determining a reference power ratio of said first and second split optical reference signals; and
   determining a difference of said center wavelength and said reference wavelength in response to said broadband power ratio and said reference power ratio.

2. The method of claim 1 further comprising the step of adjusting said center wavelength of said broadband optical signal in response to said difference of said center wavelength and said reference wavelength.

3. A system for generating a wavelength stabilized optical signal comprising:
   a broadband optical source configured to provide a broadband optical signal having a broadband center wavelength;
   a wavelength reference module configured to provide a reference optical signal having a reference center wavelength; and
   an optical power divider having a divider input port, a first divider output port and a second divider output port, said divider input port being in optical communication with said broadband optical source and said wavelength reference module, said optical power divider adapted to provide a first split broadband optical signal and a second split broadband optical signal at said first and second divider output ports, respectively, in response to said broadband optical signal, said optical power divider adapted to provide a first split reference optical signal and a second split reference optical signal at said first and second divider output ports, respectively, in response to said reference optical signal,
   wherein a power ratio of said first and second split optical signals is responsive to said broadband center wavelength and wherein a power ratio of said first and second split reference optical signals is responsive to said reference center wavelength.

4. The system of claim 3 further comprising:
   a first detector in optical communication with said first divider output port; and
   a second detector in optical communication with said second divider output port.

5. The system of claim 4 further comprising a wavelength control module in communication with said first and second detectors, said wavelength control module determining said power ratio of said first and second split broadband optical signals and determining said power ratio of said first and second split reference optical signals, said wavelength control module generating a broadband source control signal in response to said power ratios.

6. The system of claim 3 further comprising an optical combiner in optical communication with said broadband optical source, said wavelength reference module and said optical power divider.

7. The system of claim 3 further comprising a broadband optical modulator in optical communication with said broadband optical source and said optical power divider.

8. The system of claim 3 further comprising a reference optical modulator in optical communication with said wavelength reference module and said optical power divider.

9. The system of claim 3 further comprising an optical modulator in optical communication with said broadband optical source, said wavelength reference module and said optical power divider, said optical modulator adapted to intensity modulate said broadband optical signal and said reference optical signal.

10. The system of claim 3 further comprising a polarizer in optical communication with said divider input port.

11. The system of claim 3 wherein said wavelength reference module comprises a gas cell.

12. The system of claim 11 wherein a gas in said gas cell is one of acetylene, hydrogen cyanide and ammonia.

* * * * *